(12) United States Patent
Bartlett et al.

(10) Patent No.: US 7,089,223 B2
(45) Date of Patent: Aug. 8, 2006

(54) PROGRAMMABLE CONTROL OF DATA ATTRIBUTES

(75) Inventors: Andrew C. Bartlett, Westborough, MA (US); Paul Jackson, Wellesley, MA (US)

(73) Assignee: The MathWorks, Inc., Natick, MA (US)

( * ) Notice: Subject to any disclaimer, the term of this patent is extended or adjusted under 35 U.S.C. 154(b) by 889 days.

(21) Appl. No.: 09/896,925

(22) Filed: Jun. 29, 2001

(65) Prior Publication Data

US 2003/0005270 A1    Jan. 2, 2003

(51) Int. Cl.
*G06F 17/00* (2006.01)
*G06N 5/02* (2006.01)

(52) U.S. Cl. .............................. 706/47; 706/46; 706/45

(58) Field of Classification Search .................. 706/47, 706/46, 45
See application file for complete search history.

(56) References Cited

U.S. PATENT DOCUMENTS 5,159,687 A * 10/1992 Richburg ..................... 717/106
2001/0044813 A1 * 11/2001 Frank ........................... 707/530

OTHER PUBLICATIONS

Edward J. Coburn, Visual Basic Made Easy, 1995, RWS Publishing Company, 4, 5, 134, 143, 147, 159, 284, 319, 415, 419, 436, 472, 537, 538.*
*Fixed Point Blockset User's Guide*, version 3, pp. 9-27 to 9-34, Sep. 2000.

* cited by examiner

*Primary Examiner*—Joseph P. Hirl
(74) *Attorney, Agent, or Firm*—Lahive & Cockfield, LLP

(57) ABSTRACT

Software for building a block diagram representation of a system includes instructions for defining a propagation block having an input port for receiving information indicative of an attribute set of an input signal and an output port for providing information indicative of an attribute set of an output signal on the basis of the attributes of the input signal. The software includes instructions for associating, with the propagation block, a rule-set for determining the output attribute set on the basis of the input attribute-set.

40 Claims, 6 Drawing Sheets

PROGRAMMABLE CONTROL OF DATA ATTRIBUTES

FIELD OF INVENTION

This invention relates to computer simulation, and in particular, to software for building block-diagram models of systems to be simulated.

BACKGROUND

Before a computer can simulate the behavior of a system, a model of that system must be built. In many cases, a system can be described by one or more constituent elements connected together so that outputs of one element become inputs of other elements. Each such system element can be characterized by a transfer function. Such a system is often represented as a block diagram in which each system element corresponds to one of the blocks in the block diagram.

Software intended for computer simulation of systems often provides a user-interface for enabling users to define blocks representative of the constituent elements of the system. At a purely abstract level, the definition of a particular block is no more than the definition of the transfer function of the system element that that block represents. However, at the implementation level, there are many computational details to consider.

For example, to optimize performance, a system designer must consider what data types (fixed or floating point, arrays or scalars) are to be used in representing input and output signals of the block. Having done so, a designer must consider the number of bits to use for each input and output and the scaling to be applied to map a sequence of bits into a number that represents some value in a range of values. Each input or output signal of a block can thus be thought of as having two different parts: a value, and a set of attributes for representing that value. Two such attributes, already described above, are data-type and scaling attributes.

In most cases, a user can easily make the value of a block's output signals (hereafter referred to as "outputs") depend on the values of its input signals (hereafter referred to as "inputs"). This permits a change in an input's value to propagate automatically throughout the system. However, it is not so easy for a user to cause the attributes of a block's output to depend on the attributes of its inputs. As a result, in most cases, a change in an input attribute does not propagate automatically throughout the system.

SUMMARY

The invention is based on the recognition that it is possible to specify rules for determining the output signal's attributes on the basis of one or more input signal attributes. This enables a user to programmably set attributes associated with inputs and outputs of a block representative of a system element. Such a block can then be interconnected with other blocks without regard to matching the attributes of signals passed between blocks.

The invention thus includes a computer-readable medium having encoded thereon instructions for causing a computer system to receive a definition of a propagation block. The propagation block has an input port for receiving information indicative of an input attribute-set of an input signal, and an output port for providing information defining an output attribute-set of an output signal. The medium also has encoded thereon instructions for causing the computer to receive a definition of a rule-set for determining the output attribute-set on the basis of the input attribute-set. The user can program the propagation block by define the rule-set through a user-interface.

In one aspect of the invention, the instructions cause the propagation block to define an output attribute-set that includes a number of bits to be used for representing the output. In another aspect of the invention, the instructions cause the propagation block to define an output attribute-set that includes a scaling factor to be applied to the output. Such a scaling factor can include a bias, a slope, or both.

Other types of attributes can be controlled. For example, the output might be an array, in which case the instructions cause the propagation block to define an output attribute-set that includes a dimension of the array. Or, the output might include a signal, in which case the instructions cause the propagation block to define an output-attribute set that includes a sampling rate associated with the signal and/or information indicative of whether the signal is a time-based signal or a frame-based signal.

These and other features and objects of the invention will be apparent from an examination of the following detailed description and the figures, in which:

DETAILED DESCRIPTION

Software for simulating dynamic systems often provides a graphical interface for creating a block diagram of the system to be simulated. Such a block diagram typically includes several blocks, each of which is characterized by a transfer function.

To build a system model, a user drags selected blocks from a library onto a worksheet. These blocks can be built-in blocks, provided as part of the software, or user-defined blocks that a user has defined and saved in a library.

Once the selected blocks are on the worksheet, the user interconnects them to build the system. If a block having the desired transfer function is unavailable, the user can often define such a block by assembling existing blocks. As noted above, the resulting user-defined block can be saved in a library and re-used in a variety of system models.

In defining a block, a user must define the attributes of the input and output signals for the block. In most cases, the optimal selection of output signal attributes depends on the input signal attributes. The invention provides a user-interface for enabling a user to programmably define attributes of output signals on the basis of attributes of input signals.

Figure 1:
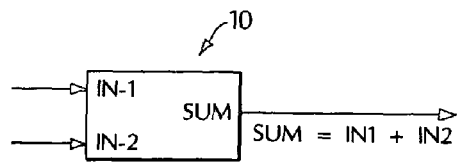
FIG. 1 shows a user-defined block that incorporates the invention.

FIG. 1 illustrates a user-defined block 10 incorporating the invention. The illustrated block 10 is intended to flawlessly and efficiently add two addends together.

To achieve flawlessness, attributes of the sum should, whenever possible, be selected to avoid rounding errors or overflow errors. To achieve efficiency, attributes of the sum should, whenever possible be selected to minimize the lengths of data types used and to avoid excessive scaling adjustments.

The optimal attributes for the addends and the sum are not independent of each other. For example, if the first and second addends are eight-bits wide, then the sum should also be eight-bits wide. This reduces (but does not eliminate) the likelihood of overflow error. However, if the first addend is sixteen bits wide and the second addend is eight-bits wide, then the sum should be sixteen-bits wide to reduce the likelihood of overflow error.

Since the optimal attributes for the sums and addends (collectively referred to as the "block variables") depend on each other, it is not possible to assign optimal attributes without a priori knowledge of the attributes assigned to at least one of the block variables. Nevertheless, it is possible to specify, in advance, rules for selecting optimal attributes of one or more block variables. Once attributes of one or more block variables become known, these rules can be applied to determine optimal attributes for other block variables.

Figure 2:
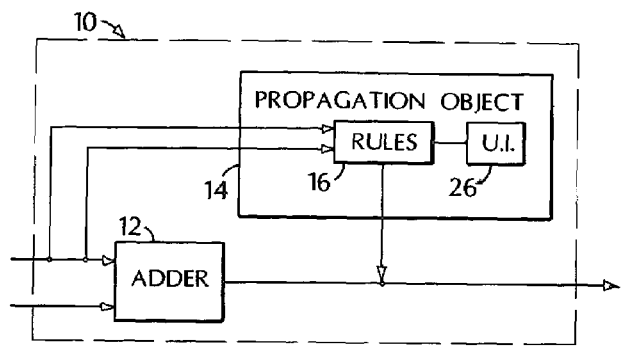
FIG. 2 shows the detailed architecture of the user-defined block in FIG. 1.

FIG. 2 shows the internal architecture of the user-defined block 10 of FIG. 1. The values of the first and second addends are provided to an adder 12, the output of which is the sum shown in FIG. 1. The adder 12 is an example of a "computation block." A computation block is one that sets the value of its output on the basis of the values of its inputs.

In the example of FIG. 2, the adder 12 is a built-in block dragged into the system model from a library of built-in blocks. A built-in block, such as the adder 12, typically includes built-in attribute-setting rules for providing output attributes on the basis of input attributes. These built-in rules are rigid and cannot easily be changed by the user. The invention provides a user-interface through which these built-in rules can be overridden by user-defined attribute setting rules.

Figure 3:
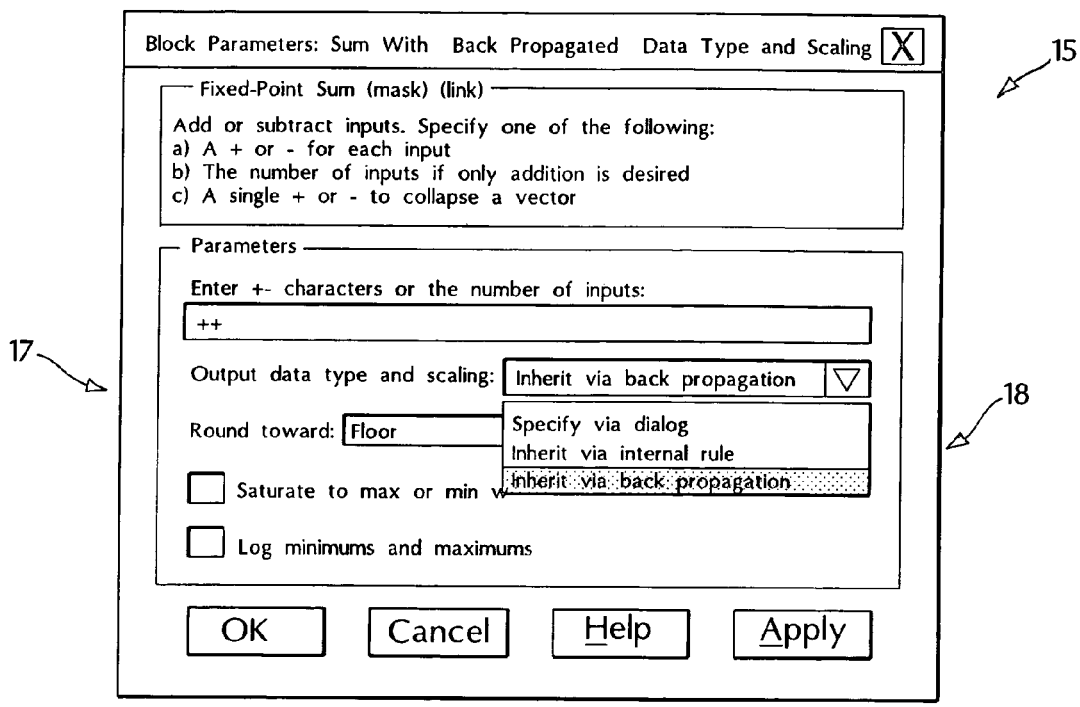
FIG. 3 shows a dialog box for causing a computation block to accept attributes specified by an attribute-propagation block.

To override the built-in attribute-setting rules, these rules are first disabled. To disable built-in attribute-setting rules of a built-in block, the user opens a dialog box that controls the attribute-setting rules associated with that block. A dialog box provided by the illustrated embodiment is shown in FIG. 3. However, user-interfaces other than dialog boxes, or dialog boxes having different layouts, can also be used.

Referring now to FIG. 3, the illustrated dialog box 15 includes options 17 for "Output data type and scaling". These options control the manner in which the built-in library block sets its output. By selecting the option entitled "Inherit via block propagation" 19, the user forces a built-in block to set attributes using rules carried out by an attribute-propagation block in communication with the built-in block.

The attributes of the first and second addends are made available to an attribute-propagation block 14 through first and second ports. Unlike a computation block, an attribute-propagation block does not operate on the values of its inputs and outputs. Instead, the attribute-propagation block determines attributes of its output signal on the basis of attributes of its input signals. This is different from a computation block, which determines the value of an output on the basis of values of its inputs.

The attribute-propagation block 14 includes a rule-set 16 for determining the optimal attributes of the sum on the basis of attributes of the first and second addends, more generally referred to as the "controlling attributes." The optimal attributes of the sum, more generally referred to as the "propagated attributes," are then provided back to the summer.

The illustrated attribute-propagation block 14 has two inputs and one output. The two inputs receive controlling attributes and the output provides a propagated attribute selected by applying rules to a subset of the controlling attributes. However, an attribute-propagation block can also have one input and one output. Alternatively, an attribute-propagation block can have many inputs and many outputs.

Figure 4:
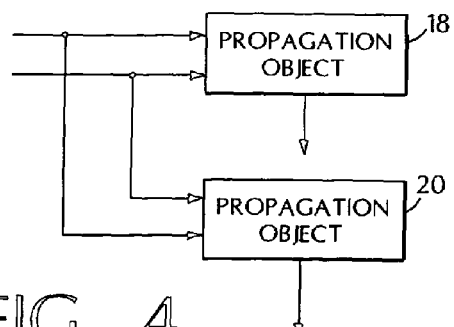
FIGS. 4 and 5 illustrate alternate methods of interconnecting the attribute-propagation block shown in FIG. 2.
Figure 5:
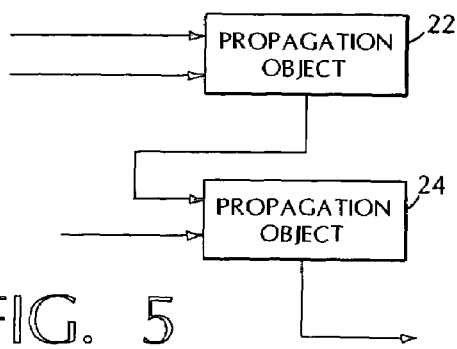

One method for achieving an attribute-propagation block having many inputs and many outputs is to appropriately interconnect attribute propagation blocks of the type shown in FIG. 2. For example, FIG. 4 illustrates a parallel connection of attribute-propagation blocks 18, 20 that effectively creates an attribute-propagation block having two inputs and two outputs. FIG. 5 illustrates daisy-chained attribute propagation blocks 22, 24 that effectively create an attribute-propagation block having three inputs and one output. The interconnections shown in FIGS. 4 and 5 can readily be combined to form attribute-propagation blocks with any number of inputs and outputs.

It is also important to note that the concept of "input" and "output" are purely logical concepts. In this context, it is useful to consider an attribute-propagation block as having a plurality of ports, each of which can be an input port or an output port depending on circumstances that become apparent only at run-time. For example, in the case of an attribute-propagation block 14 with three ports, as shown in FIG. 2, a controlling attribute can be made available at the first and third ports, in which case the attribute-propagation block 14 applies the rules in the rule-set 16 to determine a propagated attribute at the second port. In such a case, the second port is a logical output port and the first and third ports are logical input ports. However, controlling attributes might instead be made available at the second and third ports, in which case the attribute-propagation block 14 applies the rules in its rule-set 16 to determine the propagated attribute at the first port. In this case, the second port is now a logical input port and the first port becomes a logical output port.

An analogy can be drawn to the process of solving one equation with two unknowns. If one learns the value of the first unknown, one can use the equation to evaluate the second unknown. However, one could just as easily have learned the second unknown and used that, together with the equation, to evaluate the first unknown. In either case, the result would have been the same. The designation of one variable as the "given" variable and the other as derived from the given variable is thus meaningless until the evaluation has already taken place.

Figure 6:
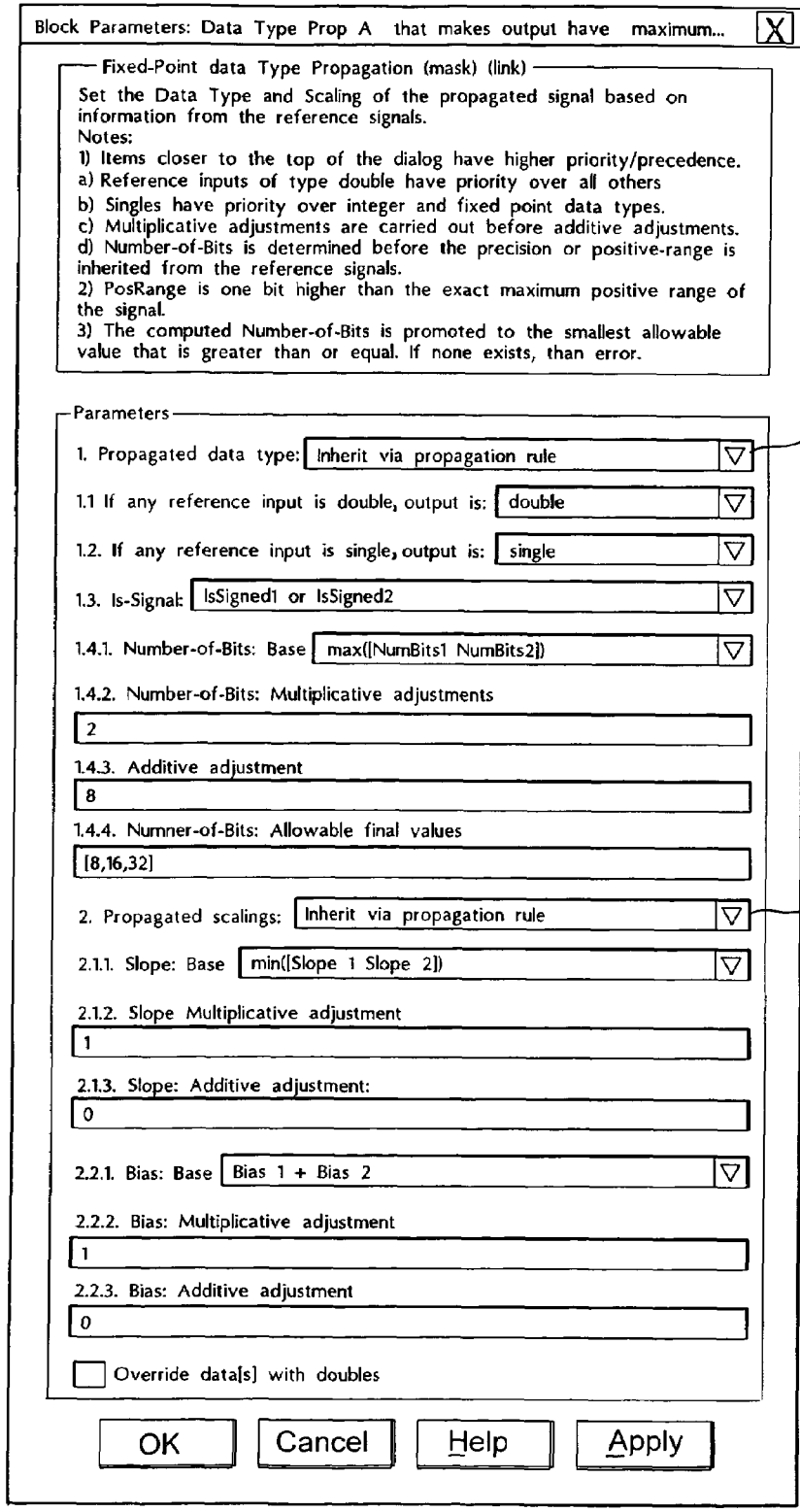
FIG. 6 is a graphical user interface element for enabling the attribute-propagation block to be programmed by a user.

The attribute-propagation block 14 also includes a user-interface 26 for enabling a user to easily alter the rules for determination of attributes. In the illustrated embodiment, the user-interface 26 is a graphical user-interface that presents user-selectable options in a dialog box 28, as shown in FIG. 6. Such a dialog box can be opened, for example, by selecting the attribute-propagation block 14 and choosing an appropriate menu command.

Referring now to FIG. 6, the illustrated dialog box 28 implements a first collection of rules 30 for controlling a first attribute, namely the data-type attribute, and a second collection of rules 32 for controlling a second attribute, namely the scaling attribute. Each collection of rules includes a switch (designated as rules 1 and 2 respectively) for disabling the function of the propagation block 14. These switches enable a user to explicitly specify one or both attributes. In the illustrated embodiment, attribute propagation is enabled by choosing "Inherit via propagation rule" in a drop-down list of options.

In some cases, the application of two rules will be impossible because of a conflict between the rules. To resolve such conflicts, each collection of rules 30, 32 includes a priority order for application of the rules. When the application of two rules results in a conflict, the rule having the higher priority is applied. The priority order of the rules is communicated to the user by listing the rules on the dialog box 28 in the order of their priority.

Rules 1.1 and 1.2 describe what should happen if the attribute of either of the addends were set to be floating point. The remaining rules 1.3 through 1.4.4 only apply if neither addend has an attribute set to be floating point.

Rule 1.3 controls whether the propagated attribute designates a signed or unsigned fixed point number. It is only necessary to designate a bit to represent a sign if there exists some way that the sum can become negative. Since this can occur when either or both of the addends is signed, rule 1.3 causes the propagated attribute to be signed if either one of the addends is signed.

To avoid rounding errors, it is necessary (though not sufficient) that the sum have at least as many bits as the widest of the addends. Rule 1.4.1 creates such a rule by setting the base number of bits based on the widest addend.

To avoid overflow errors, it is necessary that the sum have at least one bit more than the widest addend. Rules 1.4.2 and 1.4.3 cause this to be the case. These rules are set to multiply the base number of bits by 2 and then to add 0 to the resulting product. For example, suppose the first and second addends are, respectively, sixteen and eight bits wide. The base number of bits would then correspond to the wider of the two addends, namely the 16-bit addend. Rules 1.4.2 and 1.4.3 adjust this base to be 2*16+0 bits (i.e. 32 bits).

Rule 1.4.4 determines what bit sizes are allowable. In this example, the allowable sizes are 8, 16, and 32 bits. Since the adjusted base number of bits (32) happens to be an allowed value, the propagated data-type attribute would specify that the sum is a 32-bit fixed point number. If the adjusted number of bits had been other than one of the three allowed values, the propagation block 14 would have set an error message.

Rules 2 through 2.2.3 determine the scaling attributes of the output signal. The concept of scaling arises because of the need to map an integer to a range of values. For example, if an integer between 0 and 256 is to map to a value between a and b, a suitable mapping might be to multiply the integer by a "slope" of (b−a)/256 and adding a "bias" of a. The user controls the values of the slope and bias by appropriately setting values in Rules 2 through 2.2.3.

To avoid round-off error, the sum should allow as much precision as the most precise of the addends. Rule 2.1.1 determines which addend has the smallest slope, and hence which is most precise. This value will be used to set the attribute of the sum to be as precise as the most precise of the addends. Rules 2.1.2 and 2.1.3 allow a user to adjust the base slope as determined by Rule 2.1.1, either by multiplying by a constant (Rule 2.1.2) or by adding a constant (rule 2.1.3). As illustrated, these constants are set to 1 and 0 respectively. Hence, in the illustrated example, it is rule 2.1.1 that determines the slope associated with the output.

Rule 2.2.1 determines how scaling biases (also known as scaling offsets) should be treated. In the illustrated embodiment, the propagated attribute of the sum is set to have a bias equal to the sum of the biases associated with the controlling attributes of the addends. By effectively canceling the effects of the biases, rule 2.2.1 reduces the likelihood of a loss of precision or overflow resulting from bias mismatch. Rules 2.2.2 and 2.2.3 are analogous to rules 2.1.2 and 2.1.3 respectively, and are set to similar trivial values.

The user-interface 26 of FIG. 2 can take the form of a dialog box, as shown in FIG. 6. However, the user-interface 26 can take other forms, for example a tabbed dialog box, a sequence of dialog boxes such as that presented by a wizard, or menu commands. The user-interface 26 need not be a graphical user-interface 26. For example, the user-interface 26 might be stored in an external file accessible to the user.

In addition, the rule definitions shown in the dialog box 28 are representative only and are selected for the specific purpose of creating a user-defined block 10 that generates a sum from two addends. The rule definitions in the dialog box 28 will, in general, depend on the specific application of the attribute-propagation block 14.

Additional details on the user-interface 26 of the attribute-propagation block 14 are provided in an extract from "Fixed-Point Blockset Users Guide", Version 3 published by Math Works in September 2000 that is attached as an appendix to this specification.

Figure 7:
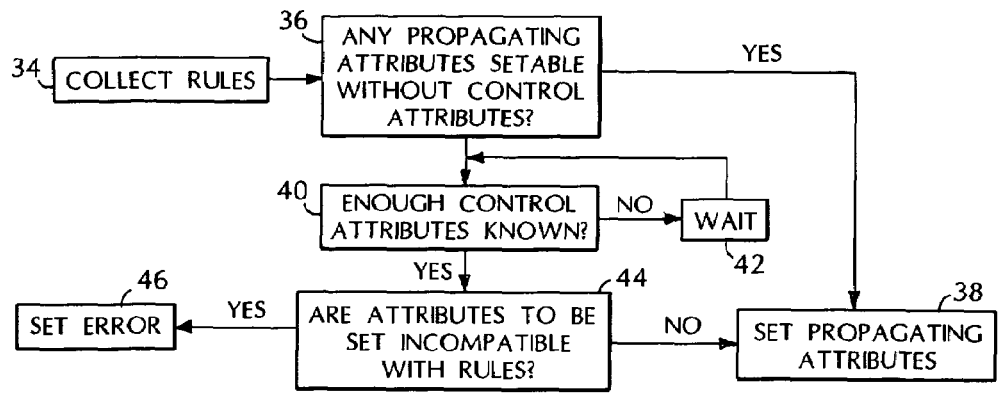
FIG. 7 shows a method carried out by the attribute-propagation block of FIG. 2.

FIG. 7 shows the process carried out by the attribute-propagation block. The propagation block begins by collecting 34 all the rules identified in the dialog box of FIG. 6. The attribute-propagation block then determines 36 whether any propagated attributes can be set without reference to any controlling attributes. If the rules permit a propagated attribute to be set without knowledge of any controlling attributes, the attribute-propagation block sets 38 the propagated attribute accordingly. If not, the attribute-propagation block collects the known attributes and determines 40 if these are sufficient to set the remaining attributes consistent with the rules. If they are not sufficient, the attribute-propagation block waits 42 and retries later.

If the known attributes are sufficient to determine a propagated attribute, then the attribute-propagation block determines 44 whether the propagated attribute can be set in a manner consistent with all the rules. If not, the attribute-propagation block posts 46 an error. Otherwise, the attribute-propagation block sets 38 the propagated attribute consistent with the rules and the known input attributes.

Figure 8:
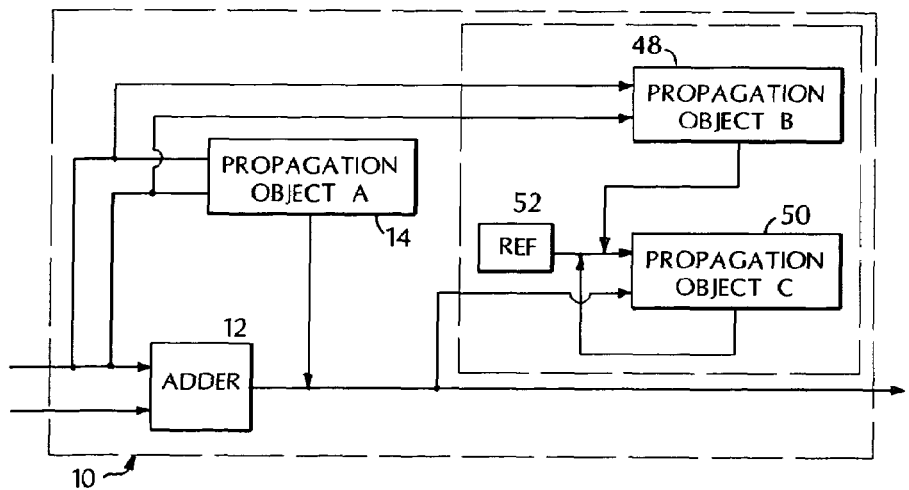
FIG. 8 shows an alternate embodiment of the system of FIG. 2.

The system 10 illustrated in FIG. 2, when implemented with a rule-set 16 as defined in FIG. 7, reduces, but does not eliminate overflow errors. To alert the user to overflow, it is useful to provide second and third attribute-propagation blocks 48, 50, as shown in FIG. 8.

Both the second and third attribute-propagation blocks 48, 50 set the same propagated attribute, namely the propagation attribute of a reference value provided by a reference block 52. So long as the second and third attribute-propagation blocks 48, 50 agree on the attribute assigned to the reference value, there is no error. If the second and third attribute-propagation blocks 48, 50 attempt to assign conflicting attributes to the reference value, an error results. The interconnection shown in FIG. 8, when combined with the rule-set definitions 52, 54 shown in FIGS. 9 and 10, are such that the occurrence of such an error is likely to correspond to an overflow.

Figure 9:
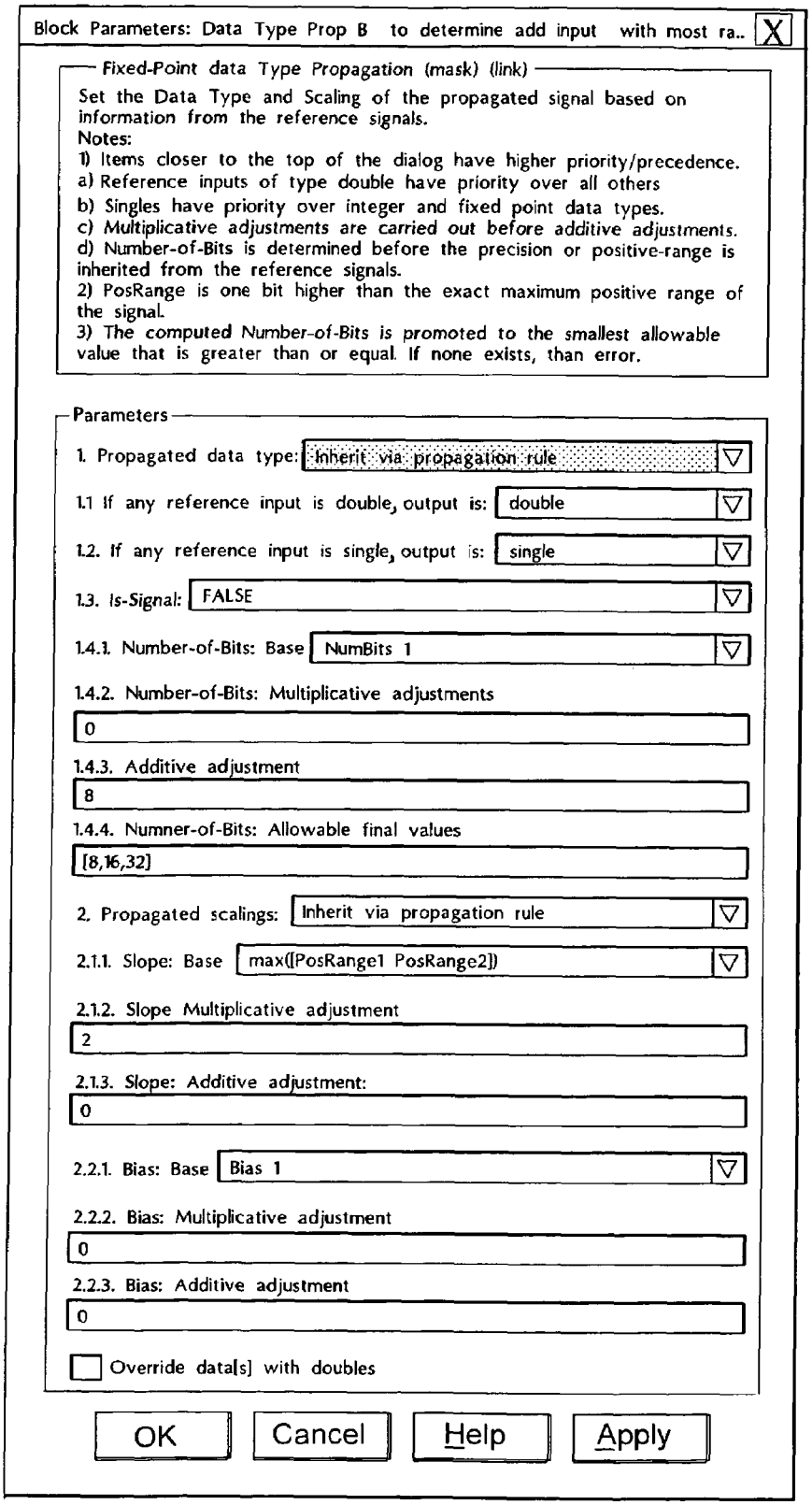
FIGS. 9 and 10 are graphical user interface elements showing the rule-sets associated with the additional attribute-propagation blocks in FIG. 8.
Figure 10:
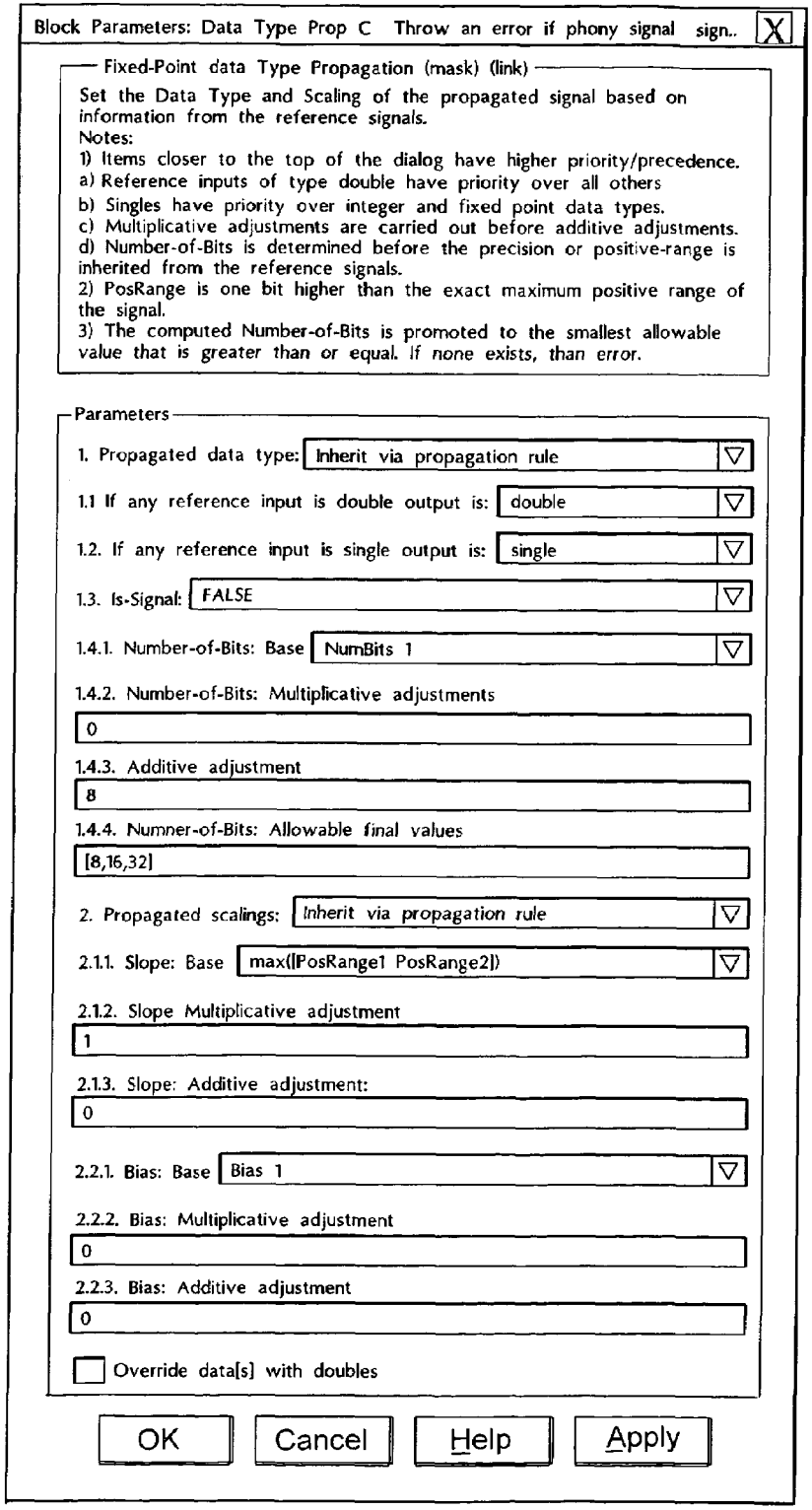

FIGS. 9 and 10 show the rule-set definitions for the second and third attribute-propagation blocks 48, 50 respectively. An examination of these figures shows that if a conflict is to arise, it will do so because of the difference in rules 2.1.1 and 2.1.2.

Using its rule 2.1.1 (see FIG. 9), the second attribute-propagation block 48 attempts to set the base of the reference signal to correspond to the addend having the greatest range. Using rule 2.1.2, the second attribute-propagation block 48 provides one additional bit of range to the sum by setting the multiplicative adjustment to double the slope. The extra bit of range insures that overflow is impossible.

Using its rule 2.1.1 (see FIG. 10), the third attribute-propagation block 50 attempts to set the base of the reference signal to correspond to the addend having the smallest, rather than the largest, range.

The attribute of the reference value is both an input attribute and an output attribute of the third attribute-propagation block 50. Consequently, if the reference value has a smaller range than the adder's output, then no conflict occurs. Otherwise an error occurs. Such an error is desirable because it alerts the user to the possibility of an overflow.

The attribute-propagation block of the invention has been described in the context of a particular application, namely a system 10 for generating the sum of two addends. This particular application has been chosen as a vehicle for describing the structure and function of the attribute-propagation block primarily for its simplicity. It will be appreciated that the attribute-propagation block of the invention has broader applications than that described in connection with the detailed description herein. For example, other attributes can be controlled by an attribute-propagation block. These attributes can include dimensions of arrays, vectors, or matrices, whether values are real or complex, sampling rates of signals, and whether signals are subject to frame-based or time-based sampling.

Appendix Page 1 of 8

FixPt Data Type Propagation

| Parameter Value | Description |
|---|---|
| Bias1 * Bias2 | The bias of Prop is given by the product of the reference signal biases. |
| Bias1 / Bias2 | The bias of Prop is given by the ratio of the Ref1 bias to the Ref2 bias. |
| Bias1 + Bias2 | The bias of Prop is given by the sum of the reference biases. |
| Bias1 - Bias2 | The bias of Prop is given by the difference of the reference biases. |

The Bias: Multiplicative adjustment parameter allows you to adjust the bias used by Prop by including a multiplicative adjustment.

The Bias: Additive adjustment parameter allows you to adjust the bias used by Prop by including an additive adjustment.

If you want to guarantee that the bias associated with Prop is zero, you should configure both the multiplicative adjustment and the additive adjustment to 0.

| Characteristics | | |
|---|---|---|
| | Input Ports | Any data type supported by the blockset |
| | Direct Feedthrough | Yes |
| | Sample Time | Inherited |
| | Scalar Expansion | Yes |
| | States | 0 |

FixPt Data Type Propagation

| Parameter Value | Description |
|---|---|
| min([PosRange1 PosRange2]) | The range of Prop is given by the minimum range of the reference signals. |
| PosRange1*PosRange2 | The range of Prop is given by the product of the reference signal ranges. |
| PosRange1/PosRange2 | The range of Prop is given by the ratio of the Ref1 range to the Ref2 range. |

You control the precision of Prop with Slope1 and Slope2, and you control the range of Prop with PosRange1 and PosRange2. Additionally, PosRange1 and PosRange2 are one bit higher than the maximum positive range of the associated reference signal.

The Slope: Multiplicative adjustment parameter allows you to adjust the slope used by Prop by including a multiplicative adjustment. For example, if you want 3 bits of additional precision (with a corresponding decrease in range), the multiplicative adjustment is $2^{-3}$.

The Slope: Additive adjustment parameter allows you to adjust the slope used by Prop by including an additive adjustment. An additive slope adjustment is often not needed. The most likely use is to set the multiplicative adjustment to 0, and set the additive adjustment to force the final slope to a specified value.

The Bias: Base parameter list specifies the bias used by Prop for the base data type. The parameter values are described below.

| Parameter Value | Description |
|---|---|
| Bias1 | The bias of Prop is given by the bias of Ref1. |
| Bias2 | The bias of Prop is given by the bias of Ref2. |
| max([Bias1 Bias2]) | The bias of Prop is given by the maximum bias of the reference signals. |
| min([Bias1 Bias2]) | The bias of Prop is given by the minimum bias of the reference signals. |

FixPt Data Type Propagation

Inheriting Scaling Information

If the Propagated scaling parameter is Inherit via propagation rule, then these dialog box parameters are available to you.

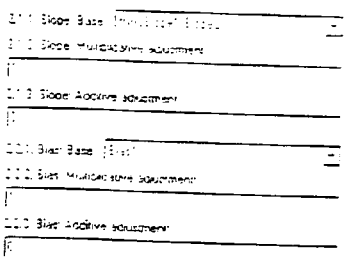

The Slope: Base parameter list specifies the slope used by Prop for the base data type. The parameter values are described below.

| Parameter Value | Description |
| --- | --- |
| Slope1 | The slope of Prop is given by the slope of Ref1. |
| Slope2 | The slope of Prop is given by the slope of Ref2. |
| max([Slope1 Slope2]) | The slope of Prop is given by the maximum slope of the reference signals. |
| min([Slope1 Slope2]) | The slope of Prop is given by the minimum slope of the reference signals. |
| Slope1*Slope2 | The slope of Prop is given by the product of the reference signal slopes. |
| Slope1/Slope2 | The slope of Prop is given by the ratio of the Ref1 slope to the Ref2 slope. |
| PosRange1 | The range of Prop is given by the range of Ref1. |
| PosRange2 | The range of Prop is given by the range of Ref2. |
| max([PosRange1 PosRange2]) | The range of Prop is given by the maximum range of the reference signals. |

FixPt Data Type Propagation

The Number of bits: base parameter list specifies the number of bits used by Prop for the base data type. The parameter values are described below

| Parameter Value | Description |
| --- | --- |
| NumBits1 | The number of bits for Prop is given by the number of bits for Ref1. |
| NumBits2 | The number of bits for Prop is given by the number of bits for Ref2. |
| max([NumBits1 NumBits2]) | The number of bits for Prop is given by the reference signal with largest number of bits. |
| min([NumBits1 NumBits2]) | The number of bits for Prop is given by the reference signal with smallest number of bits. |
| NumBits1+NumBits2 | The number of bits for Prop is given by the sum of the reference signal bits. |

Refer to "Targeting an Embedded Processor" in Chapter 7 for more information about the base data type.

The Number of bits: Multiplicative adjustment parameter allows you to adjust the number of bits used by Prop by including a multiplicative adjustment. For example, suppose you want to guarantee that the number of bits associated with a multiply and accumulate (MAC) operation is twice as wide as the input signal. To do this, you configure this parameter to the value 2.

The Number of bits: Additive adjustment parameter allows you to adjust the number of bits used by Prop by including an additive adjustment. For example, if you are performing multiple additions during a MAC operation, the result may overflow. To prevent overflow, you can associate guard bits with the propagated data type. To associate four guard bits, you specify the value 4.

The Number of bits: Allowable final values parameter allows you to force the computed number of bits used by Prop to a useful value. For example, if you are targeting a processor that supports only 8, 16, and 32 bits, then you configure this parameter to [8,16,32]. The block always propagates the smallest specified value that fits. If you want to allow all fixed-point data types, you would specify the value 1:128.

FixPt Data Type Propagation

Inheriting Data Type Information

If the Propagated data type parameter is Inherit via propagation rule, then these dialog box parameters are available to you.

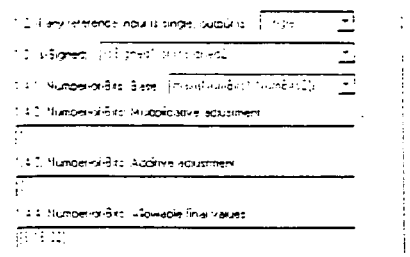

The If any reference input is single output is parameter list can be single or double. This parameter makes it easier to create designs that are easily retargeted from fixed-point chips to floating-point chips or visa versa.

The Is-Signed parameter list specifies the sign of Prop. The parameter values are described below.

| Parameter Value | Description |
| --- | --- |
| IsSigned1 | Prop is a signed data type if Ref1 is a signed data type. |
| IsSigned2 | Prop is a signed data type if Ref2 is a signed data type |
| IsSigned1 or IsSigned2 | Prop is a signed data type if either Ref1 or Ref2 are signed data types. |
| TRUE | Ref1 and Ref2 are ignored, and Prop is always a signed data type. |
| FALSE | Ref1 and Ref2 are ignored, and Prop is always an unsigned data type. |

For example, if the Ref1 signal is ufix(16), the Ref2 signal is sfix(16), and the Is-Signed parameter is IsSigned1 or IsSigned2, then Prop is forced to be a signed data type.

9-30

FixPt Data Type Propagation

Parameters and Dialog Box

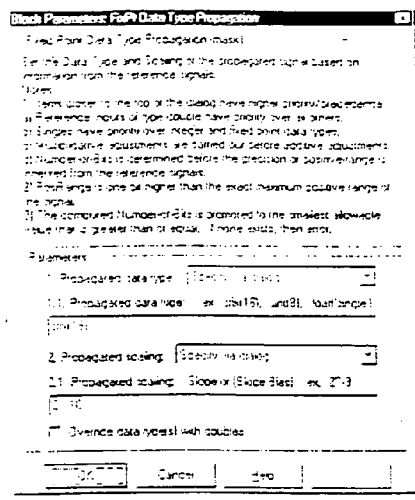

Propagated data type

Use the parameter list to propagate the data type via the dialog box, or inherit the data type from the reference signals. Use the edit field to specify the data type via the dialog box.

Propagated scaling

Use the parameter list to propagate the scaling via the dialog box, or inherit the scaling from the reference signals. Use the edit field to specify the scaling via the dialog box.

Override data type(s) with doubles

If checked, the data type is overridden with doubles.

Note The dialog box shown above does not reflect the default state of the block.

FixPt Data Type Propagation

Remarks

After you use the information from the reference signals, you can apply a second level of adjustments to the data type and scaling by using individual multiplicative and additive adjustments. This flexibility has a variety of uses. For example, if you are targeting a DSP, then you can configure the block so that the number of bits associated with a MAC (multiply and accumulate) operation is twice as wide as the input signal, and has a certain number of guard bits added to it.

The FixPt Data Type Propagation block also provides a mechanism to force the computed number of bits to a useful value. For example, if you are targeting a 16-bit micro, then the target C compiler is likely to support sizes of only 8 bits, 16 bits, and 32 bits. The block will force these three choices to be used. For example, suppose the block computes a data type size of 24 bits. Since 24 bits is not directly usable by the target chip, the signal is forced up to 32 bits, which is natively supported.

There is also a method for dealing with floating-point reference signals. This makes it easier to create designs that are easily retargeted from fixed-point chips to floating-point chips or visa versa.

The FixPt Data Type Propagation block allows you to set up libraries of useful subsystems that will be properly configured based on the connected signals. Without this data type propagation process, a subsystem that you use from a library will almost certainly not work as desired with most integer or fixed-point signals, and manual intervention to configure the data type and scaling would be required. This block can eliminate the manual intervention in many situations.

Precedence Rules

The precedence of the dialog box parameters decreases from top to bottom. Additionally:

- Double-precision reference inputs have precedence over all other data types.
- Single-precision reference inputs have precedence over integer and fixed-point data types.
- Multiplicative adjustments are carried out before additive adjustments.
- The number of bits is determined before the precision or positive range is inherited from the reference inputs.

FixPt Data Type Propagation

Purpose — Configure the data type and scaling of the propagated signal based on information from the reference signals

Description

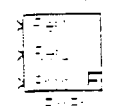

The FixPt Data Type Propagation block allows you to control the data type and scaling of signals in your model. You can use this block in conjunction with fixed-point blocks that have their Specify data type and scaling parameter configured to Inherit via back propagation.

The block has three inputs: Ref1 and Ref2 are the reference inputs, while the Prop input back propagates the data type and scaling information gathered from the reference inputs. This information is then passed on to other fixed-point blocks.

The block provides you with many choices for propagating data type and scaling information. For example, you can:

- Use the number of bits from the Ref1 reference signal, or use the number of bits from widest reference signal.
- Use the range from the Ref2 reference signal, or use the range of the reference signal with the greatest range.
- Use a bias of zero, regardless of the biases used by the reference signals.
- Use the precision of the reference signal with the least precision.

You specify how data type information is propagated with the Propagated data type parameter list. If the parameter list is configured as Specify via dialog, then you manually specify the data type via the Propagated data type edit field. Refer to "Selecting the Data Type" on page 9-4 to learn how to specify the data type. If the parameter list is configured as Inherit via propagation rule, then you must use the parameters described in "Inheriting Data Type Information" on page 9-30.

You specify how scaling information is propagated with the Propagated scaling parameter list. If the parameter list is configured as Specify via dialog, then you manually specify the scaling via the Propagated scaling edit field. Refer to "Selecting the Scaling" on page 9-7 to learn how to specify the scaling. If the parameter list is configured as Inherit via propagation rule, then you must use the parameters described in "Inheriting Scaling Information" on page 9-32.

The invention claimed is:

1. A computer-readable medium having encoded thereon instructions for causing a computer to:
receive a definition of a propagation block for a block diagram model, the propagation block comprising a graphical element of the block diagram model for propagating an attribute portion of an input signal to an output signal, the propagation block having
an input port for receiving information indicative of an input attribute-set of the input signal, and
an output port for providing information defining an output attribute-set of the output signal, and
receive, by the propagation block, a definition of a rule-set for determining one or more values of said output attribute-set on the basis of one or more values of said input attribute-set; and
provide a user-interface for enabling a user to define said rule-set.

2. The computer-readable medium of claim 1, wherein said instructions cause said propagation block to define an output attribute-set that includes a number of bits to be used for representing said output.

3. The computer-readable medium of claim 1, wherein said instructions cause said propagation block to define an output attribute-set that includes a scaling factor to be applied to said output.

4. The computer-readable medium of claim 3, wherein said instructions cause said propagation block to define a scaling factor that includes a bias.

5. The computer-readable medium of claim 3, wherein said instructions cause said propagation block to define a scaling factor that includes a slope.

6. The computer-readable medium of claim 1, wherein said output includes an array and said instructions cause said propagation block to define an output attribute-set that includes a dimension of said array.

7. The computer-readable medium of claim 1, wherein said output includes a signal and said instructions cause said propagation block to define an output-attribute set that includes a sampling rate associated with said signal.

8. The computer-readable medium of claim 1, wherein said output includes a signal and said instructions cause said propagation block to define an output-attribute set that includes information indicative of whether said signal is a time-based signal or a frame-based signal.

9. The computer-readable medium of claim 1, wherein said input includes a plurality of variables and said instructions for receiving a definition of a rule-set comprise instructions for defining the rule-set to determine said output attribute-set on the basis of a subset of said plurality of variables.

10. The computer-readable medium of claim 9, wherein said instructions for receiving a definition of a rule-set comprise instructions for defining the rule-set to determine said subset of said plurality of variables.

11. The computer-readable medium of claim 10, wherein said instructions for receiving a definition of a rule-set comprise instructions for defining the rule-set to determine said subset on the basis of an order in which said input-attributes become available to a second object.

12. The computer-readable medium of claim 10, wherein said instructions for receiving a definition of a rule-set comprise instructions for defining the rule-set to determine said subset on the basis of weights assigned to each of said input-attributes.

13. In a block diagram simulation system provided by one or more electronic devices, a method of:
defining a propagation block of a block diagram model in the block diagram simulation system, the propagation block comprising a graphical element of the block diagram model for propagating an attribute portion of an input signal to an output signal, the propagation block having an input port for receiving information indicative of an input attribute-set of an input signal and an output port for providing information indicative of an output attribute-set of an output signal:
associating with said propagation block a rule-set for determining one or more values of said output attribute-set on the basis of one or more values of said input attribute-set: and
providing a user-interface for enabling a user to revise said rule-set.

14. A method of transferring software from a source computer-system to a target computer-system, said method comprising:
transferring, to said target computer-system, instructions for causing said target computer-system to receive a definition of a propagation block for a block diagram model, the propagation block comprising a graphical element of the block diagram model for propagating an attribute portion of an input signal to an output signal, the propagation block having an input port for receiving information indicative of an input attribute-set of an input signal, and an output port for providing information defining an output attribute-set of an output signal, and
transferring, to said target computer-system, instructions for causing said target computer-system to receive, by the propagation block, a definition of a rule-set for determining one or more values of said output attribute-set on the basis of one or more values of said input attribute-set: and
transferring, to said target computer-system, instructions for causing said target computer-system to provide a user-interface for enabling a user to define said rule-set.

15. The method of claim 14, further comprising transferring, to said target computer-system, instructions for causing said target computer-system to define an output attribute-set that includes a number of bits to be used for representing said output.

16. The method of claim 14, further comprising transferring, to said target computer-system, instructions for causing said target computer-system to define an output attribute-set that includes a scaling factor to be applied to said output.

17. The method of claim 16, wherein transferring instructions for causing said target computer-system to define an output attribute-set comprises transferring instructions for defining a scaling factor that includes a bias.

18. The method of claim 16, wherein transferring instructions for causing said target computer-system to define an output attribute-set comprises transferring instructions for defining a scaling factor that includes a slope.

19. The method of claim 14, wherein said output includes an array and transferring instructions for causing said target computer-system to define an output attribute-set comprises transferring instructions for defining an output attribute-set that includes a dimension of said array.

20. The method of claim 14, wherein said output includes a signal and transferring instructions for causing said target computer-system to define an output attribute-set comprises transferring instructions for defining an output-attribute set that includes a sampling rate associated with said signal.

21. The method of claim 14, wherein said output includes a signal and transferring instructions for causing said target-computer system to define an output attribute-set comprises transferring instructions for defining an output-attribute set that includes information indicative of whether said signal is a time-based signal or a frame-based signal.

22. The method of claim 14, wherein said input includes a plurality of variables and transferring instructions for causing said target computer system to receive a definition of a rule-set comprises transferring instructions for defining the rule-set to determine said output attribute-set on the basis of a subset of said plurality of variables.

23. The method of claim 22, wherein transferring instructions for receiving a definition of a rule-set comprises transferring instructions for defining the rule-set to determine said subset of said plurality of variables.

24. The method of claim 23, wherein transferring instructions for receiving a definition of a rule-set comprises transferring instructions for defining the rule-set to determine said subset on the basis of an order in which said input-attributes become available to a second object.

25. The method of claim 23, wherein transferring instructions for receiving a definition of a rule-set comprises transferring instructions for defining the rule-set to determine said subset on the basis of weights assigned to each of said input-attributes.

26. In one or more electronic devices, a method of controlling an attribute of an output signal of a block in a block diagram model from an attribute of an input signal, the method comprising the steps of:
   providing, in a block diagram model, a propagation block having at least one input port associated with an input signal of a block in the block diagram model, the propagation block comprising a graphical element of the block diagram model for propagating an attribute portion of the input signal to an output signal;
   receiving, by the propagation block, at least one attribute of the input signal;
   determining, by the propagation block, a value of at least one output attribute based on a value of the at least one attribute of the input signal; and
   providing, by the propagation block, the at least one output attribute in association with the output signal of the block.

27. The method of claim 26, wherein the at least one attribute of the input signal comprises information indicative of at least one of the following of the input signal: a data type, number of bits, a bias, a precision, and a range.

28. The method of claim 26, comprising determining at least one of a data type or a scaling of the output attribute based on the at least one attribute of the input signal.

29. The method of claim 26, wherein the propagation block is configurable via a user interface to provide one or more propagation rules for determining the at least one output attribute based on the at least one attribute of the input signal.

30. The method of claim 29, wherein the one or more propagation rules includes a priority order for applying the one or more propagation rules.

31. A computer-readable medium having encoded thereon instructions for causing a computer system to:
   providing, in a block diagram model, a propagation block having at least one input port associated with an input signal of a block in the block diagram model, the propagation block comprising a graphical element of the block diagram model for propagating an attribute portion of the input signal to an output signal;
   receiving, by the propagation block, at least one attribute of the input signal;
   determining, by the propagation block, a value of at least one output attribute based on a value of the at least one attribute of the input signal; and
   providing, by the propagation block, the at least one output attribute in association with the output signal of the block.

32. The medium of claim 31, wherein the at least one attribute of the input signal comprises information indicative of at least one of the following of the input signal: a data type, number of bits, a bias, a precision, and a range.

33. The medium of claim 31, comprising determining at least one of a data type or a scaling of the output attribute based on the at least one attribute of the input signal.

34. The medium of claim 31, wherein the propagation block is configurable via a user interface to provide one or more propagation rules for determining the at least one output attribute based on the at least one attribute of the input signal.

35. The medium of claim 34, wherein the one or more propagation rules includes a priority order for applying the one or more propagation rules.

36. A method of transferring software from a source computer-system to a target computer-system, said method comprising:
   transferring, to said target computer-system, instructions for causing said target computer-system to provide in a block diagram model a propagation block having at least one input port associated with an input signal of a block in the block diagram model, the propagation block comprising a graphical element of the block diagram model for propagating an attribute portion of the input signal to an output signal;
   transferring, to said target computer-system, instructions for causing said target computer-system to receive, by the propagation block, a definition of a rule-set for determining said output attribute-set on the basis of said input attribute-set; and
   transferring, to said target computer-system, instructions for causing said target computer-system to provide to the propagation block at least one attribute of the input signal;
   transferring, to said target computer-system, instructions for causing said target computer-system to determine via the propagation block a value of at least one output attribute based on a value of the at least one attribute of the input signal; and
   transferring, to said target computer-system, instructions for causing said target computer-system to provide via the propagation block the at least one output attribute in association with the output signal of the block.

37. The method of claim 36, wherein the at least one attribute of the input signal comprises information indicative of at least one of the following of the input signal: a data type, number of bits, a bias, a precision, and a range.

38. The method of claim 36, comprising determining at least one of a data type or a scaling of the output attribute based on the at least one attribute of the input signal.

39. The method of claim 36, wherein the propagation block is configurable via a user interface to provide one or more propagation rules for determining the at least one output attribute based on the at least one attribute of the input signal.

40. The method of claim 39, wherein the one or more propagation rules includes a priority order for applying the one or more propagation rules.

* * * * *